(12) United States Patent
Oh et al.

(10) Patent No.: US 6,606,272 B2
(45) Date of Patent: Aug. 12, 2003

(54) METHOD AND CIRCUIT FOR PROCESSING OUTPUT DATA IN PIPELINED CIRCUITS

(75) Inventors: Jong-Hoon Oh, Fremont, CA (US); Young-Seog Kim, Cupertino, CA (US)

(73) Assignee: G-Link Technology, Milpitas, CA (US)

( * ) Notice: Subject to any disclaimer, the term of this patent is extended or adjusted under 35 U.S.C. 154(b) by 64 days.

(21) Appl. No.: 09/823,325

(22) Filed: Mar. 29, 2001

(65) Prior Publication Data
US 2002/0141251 A1 Oct. 3, 2002

(51) Int. Cl.[7] .................................................. G11C 7/00

(52) U.S. Cl. .................... 365/189.12; 365/219; 365/221

(58) Field of Search ........................... 365/189.12, 240, 365/219, 221

(56) References Cited

U.S. PATENT DOCUMENTS 5,854,840 A * 12/1998 Cannella, Jr. ................. 380/9

* cited by examiner

Primary Examiner—Vu A. Le
(74) Attorney, Agent, or Firm—Townsend and Townsend and Crew LLP; Chad R. Walsh

(57) ABSTRACT

A circuit according to the present invention includes a plurality of data registers each coupled between the output terminal and a data bus. Each data register stores successive data bits received serially from the data bus. The circuit also includes a plurality of output enable signals each coupled to a corresponding data register. Additionally, the circuit includes a mode select circuit to program the plurality of output enable signals to operate in one of a plurality of modes corresponding to a programmable latency period, wherein in a first mode the output enable signals have a first pulse width and in a second mode the output enable signals have a second pulse width greater than the first pulse width. The circuit may be included as part of a memory circuit in a memory system.

33 Claims, 12 Drawing Sheets

METHOD AND CIRCUIT FOR PROCESSING OUTPUT DATA IN PIPELINED CIRCUITS

BACKGROUND OF THE INVENTION

The present invention relates in general to integrated circuits that process data in a pipelined fashion, and in particular to an improved data transmission circuit that enhances speed and throughput.

Pipelining techniques have been used in synchronous circuits such as microprocessors and synchronous memories to improve data throughput. There is usually latency associated with pipelined operations. Latency refers to the number of system clock cycles it takes for the first bit of data to propagate to the output of the circuit, after which subsequent bits of data typically arrive within one clock cycle. For example, a synchronous memory circuit such as the synchronous dynamic random access memory (SDRAM), may provide for latency of one, two, three, or higher depending on the system requirements. In the context of SDRAMs, while latency is measured by the number of clock cycles, it is commonly referred to as column access strobe or CAS latency, or CL.

An improved method of pipelining is known as wave pipelining wherein data is serially pipelined to the output, stored in parallel output registers, and then clocked out serially in the sequence received. This type of wave pipelining has been employed in SDRAMs that provide for programmable latency of, e.g., 1, 2 and 3. A common implementation of a wave pipelined SDRAM with a maximum latency of N provides N output data registers (QREG) located near each output terminal (DQ). The N registers store N bits of output data before serially clocking the data out to the output terminal.

FIG. 1 illustrates another implementation of data pipelining wherein a data transmission output circuit 100 utilizes N−1 registers per DQ terminal rather than N registers per DQ terminal. Output circuit 100 includes N−1 output data registers QREG0 110, QREG1 111, QREG2 112, QREG N−1 113. The input of each register is coupled to an internal data bus 120. Additionally, the output of each register is coupled to an output terminal DQ 190. Data is serially provided on the bus 120 and sequentially loaded into each of the N−1 registers in accordance with individual input enable signals EN_QR_IN0, EN_QR_IN1, EN_QR_IN2, and EN_QR_IN_N−1. Data is transmitted from each of the N−1 registers to the output terminal DQ in accordance with individual output enable signals EN_QR_OUT0, EN_QR_OUT1, EN_QR_OUT2, and EN_QR_OUT_N−1. Employing the technique of FIG. 1, a CAS latency value L=N may be implemented using only N−1 output registers.

FIG. 2 is a timing diagram illustrating the operation of a data transmission output circuit for the case of a maximum CAS latency of 3 (L=N=3) using N−1=2 registers per DQ terminal. Generally, it is desirable to minimize the clock period and thereby increase the frequency of the system. However, as shown in FIG. 2, the minimum clock period for the case of L=3 is constrained by at least two factors. First, the period tAA represents the time between the receipt of the read request and the time the data is available at the output of an output data register (e.g. QREG0). Second, the period tRQ represents the time between the receipt of an output enable signal (e.g. EN_QR_OUT0) and the time the data signal has propagated to the output terminal DQ and is available for reading. In other words, tAA is the address access time, and tRQ is the propagation time from QREG to output terminal DQ. Accordingly, for L=3, the sum of these two periods must be less than 3 clock cycles. However, tAA is primarily determined by the fabrication process and the inherent delays in accessing and transferring data from the memory array. Furthermore, tRQ is based on the electrical properties of the output circuit (e.g. layout and circuit architecture). Therefore, for L=3, both tAA and tRQ are effectively constant constraints. Therefore, the relation 3*tCLK>tAA+tRQ must be satisfied. Alternatively, a minimum clock period is given by tCLK, min=(tAA+tRQ)/3. However, for the case of L=3, there is a two clock cycle margin. Therefore, the address access time tAA is typically not a limiting factor for a read request (i.e. two clock cycles plus the time it takes for the first output enable pulse EN_QR_OUT to be removed (tP2) is greater than tAA).

One further critical timing constraint on the circuit of FIG. 1 is that the output enable signal EN_QR_OUT must be disabled before the arrival of the next data bit from the data bus into the output register (e.g. QREG0). For example, referring to FIG. 1, EN_QR_OUT must be disabled before time marker Ti (i.e. the arrival of Q2 at QREG0). If EN_QR_OUT is not disable before TI, then the new data bit (e.g. Q2) will be passed through the output register (e.g. QREG0) to the output, and thereby lead to a possible read error. Therefore, the system timing must be constrained such that tP2, the point at which the output enable signal is disabled, is less than t1, the time between the last prior clock pulse and marker T1, the point at which the next data bit arrives from the bus into the output register. Note that t1 is the access time of data bit Q2, and therefore, t1=tAA. Accordingly, typical pipelined systems have employed pulsed output enable signals (e.g. EN_QR_OUT<1:0>) with timing control to serialize the output data such that proper data is transmitted to the output terminal DQ before new data is loaded into the output registers.

However, an N−1 output register implementation of a data transmission output circuit presents a different set of timing requirements when the SDRAM is programmed for a latency less than the maximum latency N (i.e. L<N). Specifically, if the circuit is programmed for L=N−1=2, there is only one clock cycle margin provided for the QREG0 enable pulse EN_QR_OUT<0>. FIG. 3 is a timing diagram illustrating the operation of a data transmission output circuit for the case of CAS latency of two. Similar to the case of L=N=3 above, there is a timing constraint of 2*tCLK>tAA+tRQ. Accordingly, the minimum clock cycle is tCLK, min=(tAA+tRQ)/2. However, for the case of L=2, the address access time tAA may become a limiting factor. Therefore, in addition to the first constraint, tAA must also not exceed one clock cycle tCLK plus tP2. In other words, the data retrieved in response to a read access must be in the output register before the output enable signal is disabled. If tAA is greater than this time period, EN_QR_OUT will be disable before the data arrives in QREG, and the data will not be passed to the output terminal DQ. Thus, in the case of L=2, there is a second limitation that tCLK,min=tAA−tP2. Therefore, in the case of L=2 the clock frequency of the system may need to be reduced beyond the minimum defined by tCLK,min=(tAA+tRQ)/2 to ensure that the output enable pulse (i.e. EN_QR_OUT) remains active until after valid data has arrived (i.e., after tAA).

Accordingly, operating a pipelined circuit with a latency value L that is less than the maximum latency N in the N−1 register implementation, results in a speed penalty. What is needed is a circuit and method for processing output data in a pipelined circuit that does not impose timing restrictions that adversely affect the speed of the system.

BRIEF SUMMARY OF THE INVENTION

In accordance with one embodiment of the present invention, a memory circuit includes an output terminal, a plurality of data registers each coupled between the output terminal and a data bus, each storing successive data bits received serially from the data bus, a plurality of enable signals each coupled to a corresponding data register, wherein when one of the plurality of enable signals is active a data bit in the corresponding data register is coupled to the output terminal and when one of the plurality of enable signals is inactive a data bit in the corresponding data register is not coupled to the output terminal, and a mode select circuit to program the plurality of enable signals to operate in one of a plurality of modes corresponding to a programmable latency period, wherein in a first mode the enable signals have a first pulse width and in a second mode the enable signals have a second pulse width greater than the first pulse width.

In one embodiment, the memory circuit has a maximum programmable latency period of N and plurality of data registers and corresponding enable signals is N–1.

In another embodiment, when the latency period is programmed for N, the enable signals operate in a first mode, and when the latency period is programmed for less than N, the enable signals operate in the second mode.

In accordance with another embodiment of the present invention, a data transmission circuit having a maximum programmable latency of N includes an output terminal, N–1 output registers configured to store N–1 bits of data, each output register having an output coupled to the output terminal, and a parallel-to-serial converter coupled to the N–1 output registers and configured to serialize the N–1 bits of data in response to an output enable signal, wherein, when the circuit operates with a latency of N, the output enable signal has a first pulsed width, and when the circuit operates with a latency less than N, the output enable signal has a second pulse width.

In accordance with another embodiment, the present invention includes a method of transmitting data to an output terminal of a memory system comprising programming a latency period in the memory system, programming a plurality output enable signals to operate in one of a plurality of modes corresponding to the latency period, wherein in a first mode the output enable signals have a first pulse width and in a second mode the output enable signals have a second pulse width, sequentially storing output data in a plurality of output registers, wherein each output register is coupled to the output terminal, generating the plurality of output enable signals, and coupling each of the plurality of output enable signals to a corresponding one of the plurality of output registers, wherein each output enable signal selectively couples a data bit in a corresponding output register to the output terminal.

In accordance with another embodiment, the present invention includes a method of operating a pipelined circuit having a maximum latency of N, the method comprising converting data from a serial bit stream to N–1 parallel bits of data, steering the N–1 parallel bits of data into N–1 output registers, and converting the N–1 parallel bits of data into serial data, wherein when the circuit operates with a latency of N, the conversion utilizes output enable signals having a first pulse width, and when the circuit operates with a latency of less than N, the conversion utilizes output enable signals having a second pulse width.

The following detailed description and the accompanying drawings provide a better understanding of the nature and advantages of the present invention.

DETAILED DESCRIPTION OF THE INVENTION

The present invention offers an improved circuit and method for transmitting data to an output terminal. Additionally, in one embodiment, the present invention offers an improved implementation for pipelined output data processing that removes the additional limitations on the minimum clock cycle when the pipeline is operated with a latency less than the maximum latency. The present invention may be particularly useful in memory circuits and systems for controlling the transmission of data from a memory chip in response to a read request. In one embodiment which includes a pipelined circuit having a maximum latency of N, the invention employs N–1 output registers per output terminal, wherein, when operating with a maximum latency N, the data in the N–1 registers are switched out to the output terminal using pulses having a first pulse width, and when operating with a latency of less than the maximum latency, the data in the N–1 registers are switched out to the output terminal using pulses having a second pulse width greater than the first pulse width.

Figure 1:
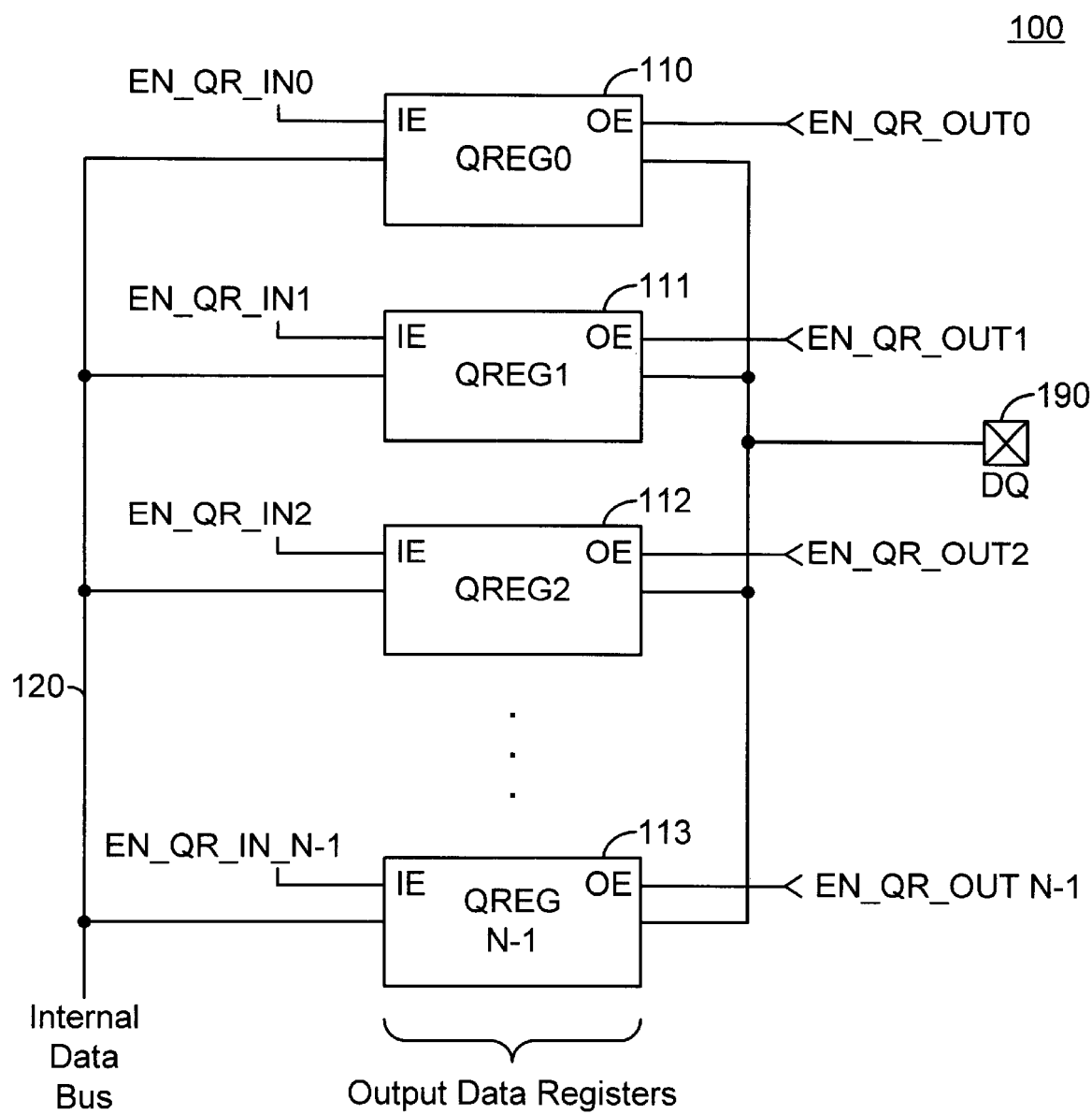
FIG. 1 illustrates a data transmission output circuit for implementing output data pipelining.
Figure 2:
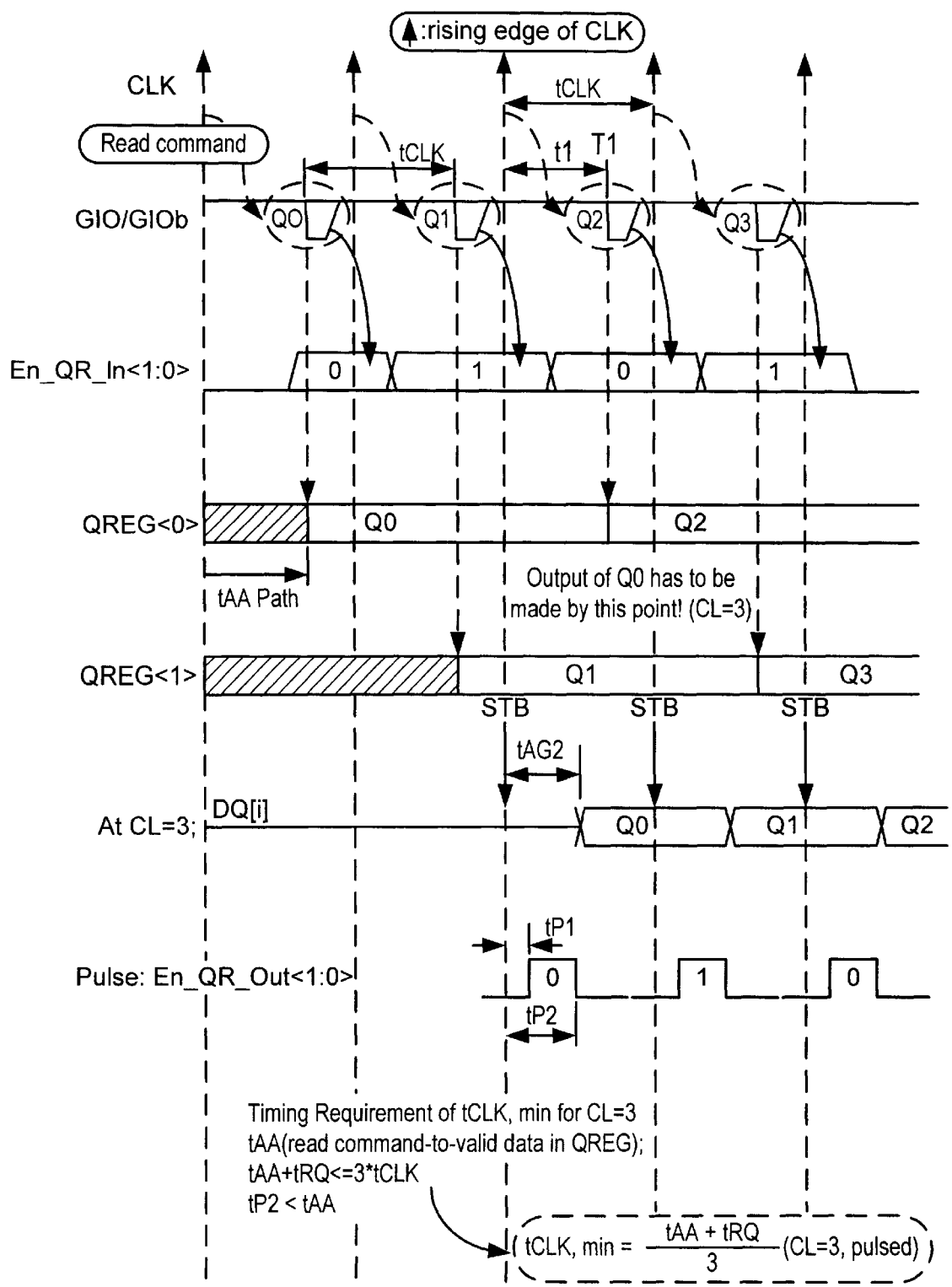
FIG. 2 is a timing diagram illustrating the operation of a data transmission output circuit for the case of a maximum CAS latency of three using two output data registers.
Figure 3:
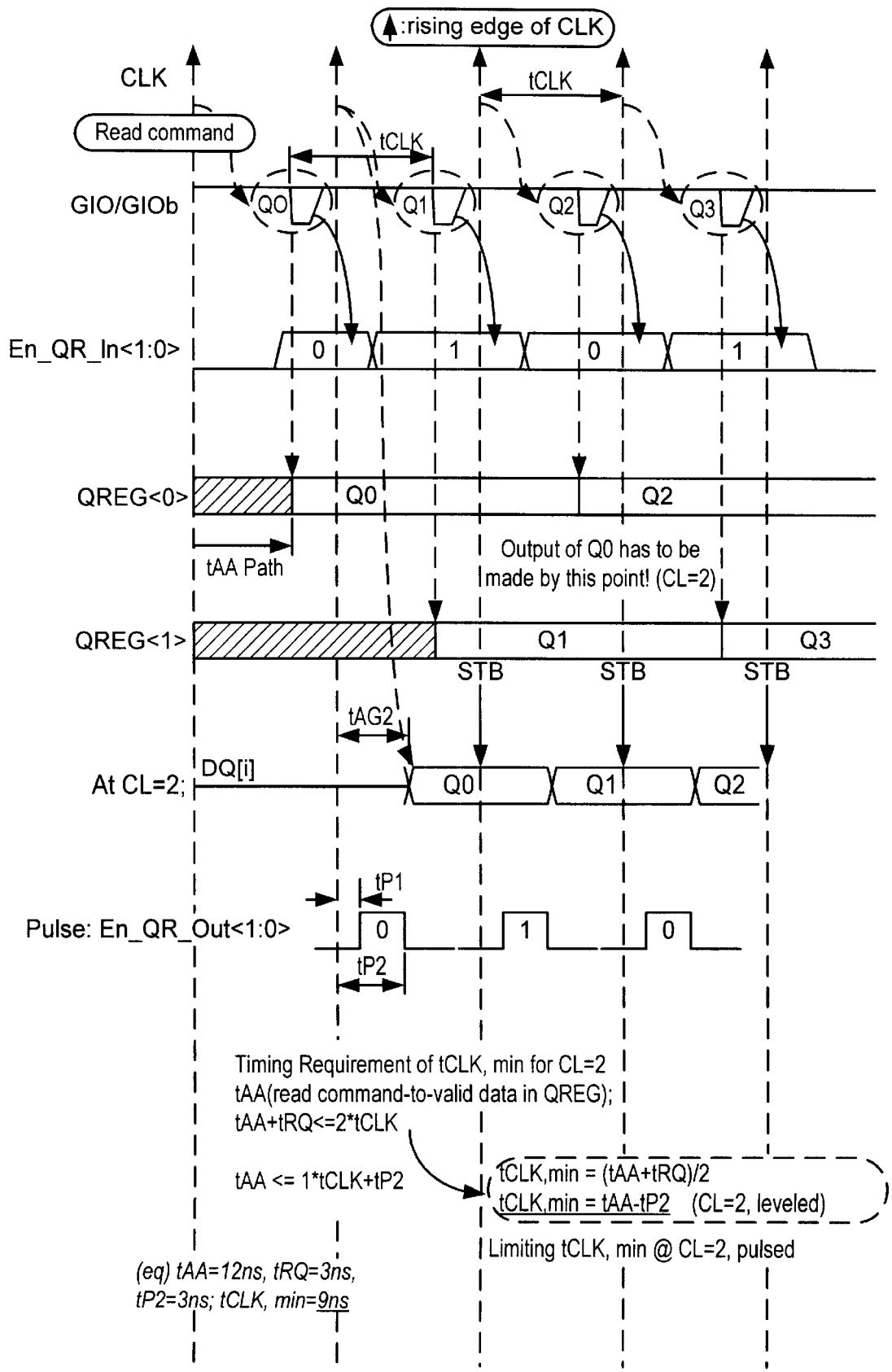
FIG. 3 is a timing diagram illustrating the operation of a data transmission output circuit for the case of CAS latency of two.
Figure 4:
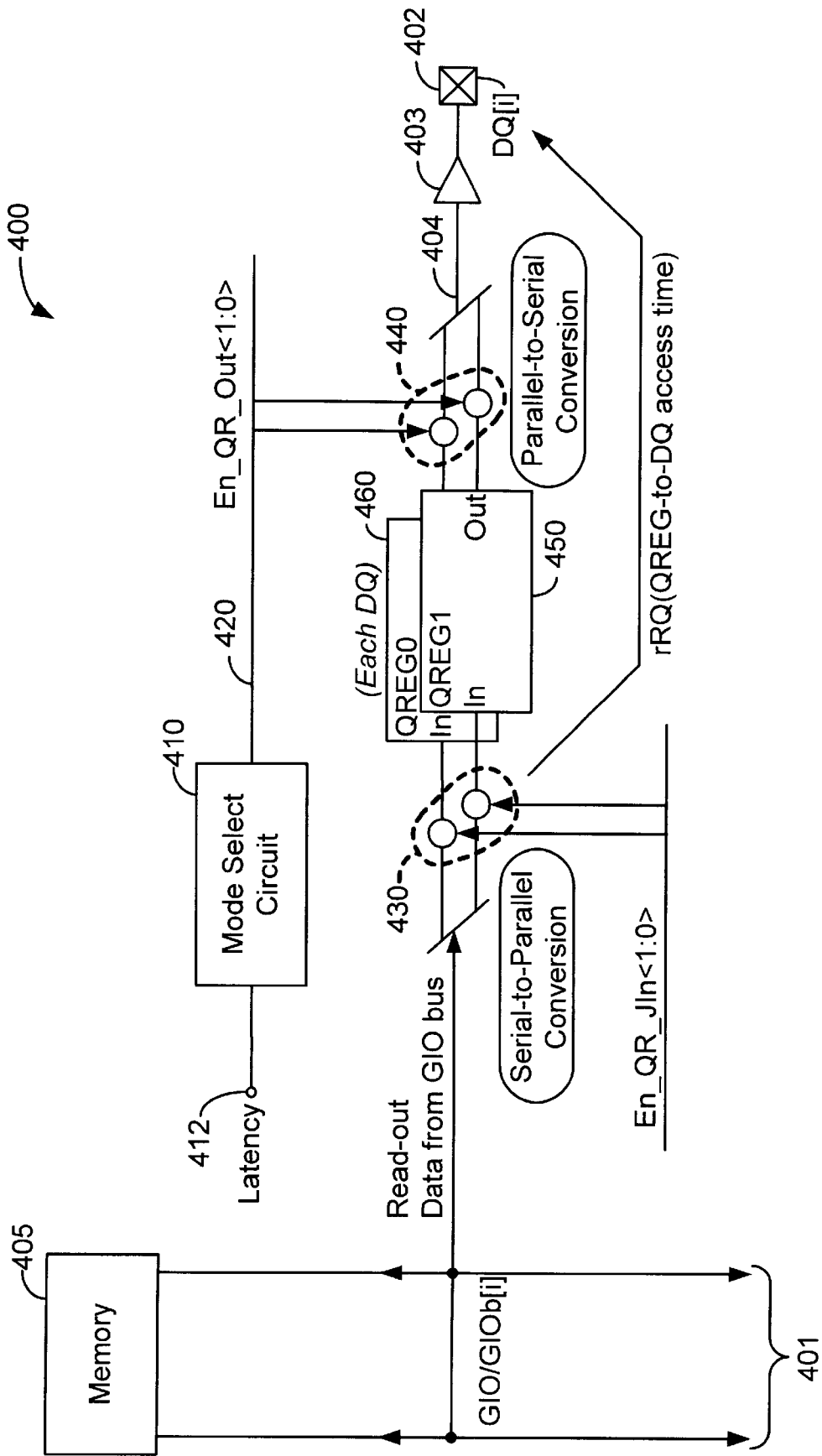
FIG. 4 shows a simplified block diagram for an output circuit according to one embodiment of the present invention.

FIG. 4 shows a simplified block diagram for an output circuit 400 according to one embodiment of the present invention. The output circuit 400 is useful for transmitting data between an internal data bus 401 and output terminal

402. The output circuit may be used as part of a memory circuit in a memory system. For example, in one embodiment the data bus 401 may be coupled to a memory 405. In one embodiment the memory may be a synchronous dynamic random access memory ("SDRAM"). In another embodiment, the output circuit may be used in an asynchronous DRAM. In one embodiment, the output circuit may be used in a double data rate memory system ("DDR"). However, the present invention is not limited to the above mentioned systems and may be useful in any system transmitting data from a data bus to an output terminal.

Serial data from the data bus, in the form of a serial bit stream, is sequentially stored in output data registers. The number of output registers will typically depend on the maximum latency N supported by a particular system. Generally, for a maximum latency of N, the system will include N−1 output data registers. For the embodiment shown in FIG. 4 there are two output data registers 450 and 460. Accordingly, the system supports a maximum latency of N=3 (i.e. N−1=2). It is to be understood other maximum latency values could be used and the present example is therefore illustrative only. In one embodiment, the serial bit stream is sequentially stored in each output data register. The serial data is loaded into each output register by the operation of a serial-to-parallel converter 430. The serial-to-parallel converter 430 receives a signal EN_QR_IN<1:0> for selectively steering data bits in the serial bit stream into each register. The output data registers are also coupled to a parallel-to-serial converter 440. The parallel-to-serial converter 440 receives a signal EN_QR_OUT<1:0> for successively transmitting data in the output data registers to the output terminal. In one embodiment, the parallel-to-serial converter 440 may be a multiplexor ("MUX") that serializes the outputs of the two QREGs before supplying them to the output terminal DQ.

The signal EN_QR_OUT<1:0> is generated by a mode select circuit 410 that receives a latency programming signal at a programming input terminal 412. Generally, the output circuit may be programmed with a latency value L between 1 and the maximum latency supported by the system, N (i.e. L=N, N−1, . . . , or 1). The latency value L generally refers to the period of time between a request for data to be output at the output terminal and the time the data is available at the output terminal (i.e. the latency period). The latency period is typically given in system clock cycles (e.g. tCLK). For example, a memory system may be programmed with a maximum latency period of L=N corresponding to N system clock cycles between a read request and a time when the requested data is available at the output terminal of the memory system. In other embodiments the memory system may be programmed for L=N−1, N−2, . . . , or 1, for example.

EN_QR_OUT<1:0> controls the flow of data between the output data registers and the output terminal. Accordingly, EN_QR_OUT<1:0> will typically have a number of unique signal lines equal to the number of output data registers (i.e. N−1). The output enable signals making up EN_QR_OUT<1:0> will selectively couple data bits in each output data register to output line 404 by controlling the action of the parallel-to-serial converter. Output line 404 is coupled to an output driver 403, and the output driver transmits the data to the output terminal 402. In one embodiment, output driver 403 may include a latch for holding the data received by the output driver such that the data may be driven onto the output terminal 402 for a predetermined period of time (e.g. one system clock period).

Figure 5:
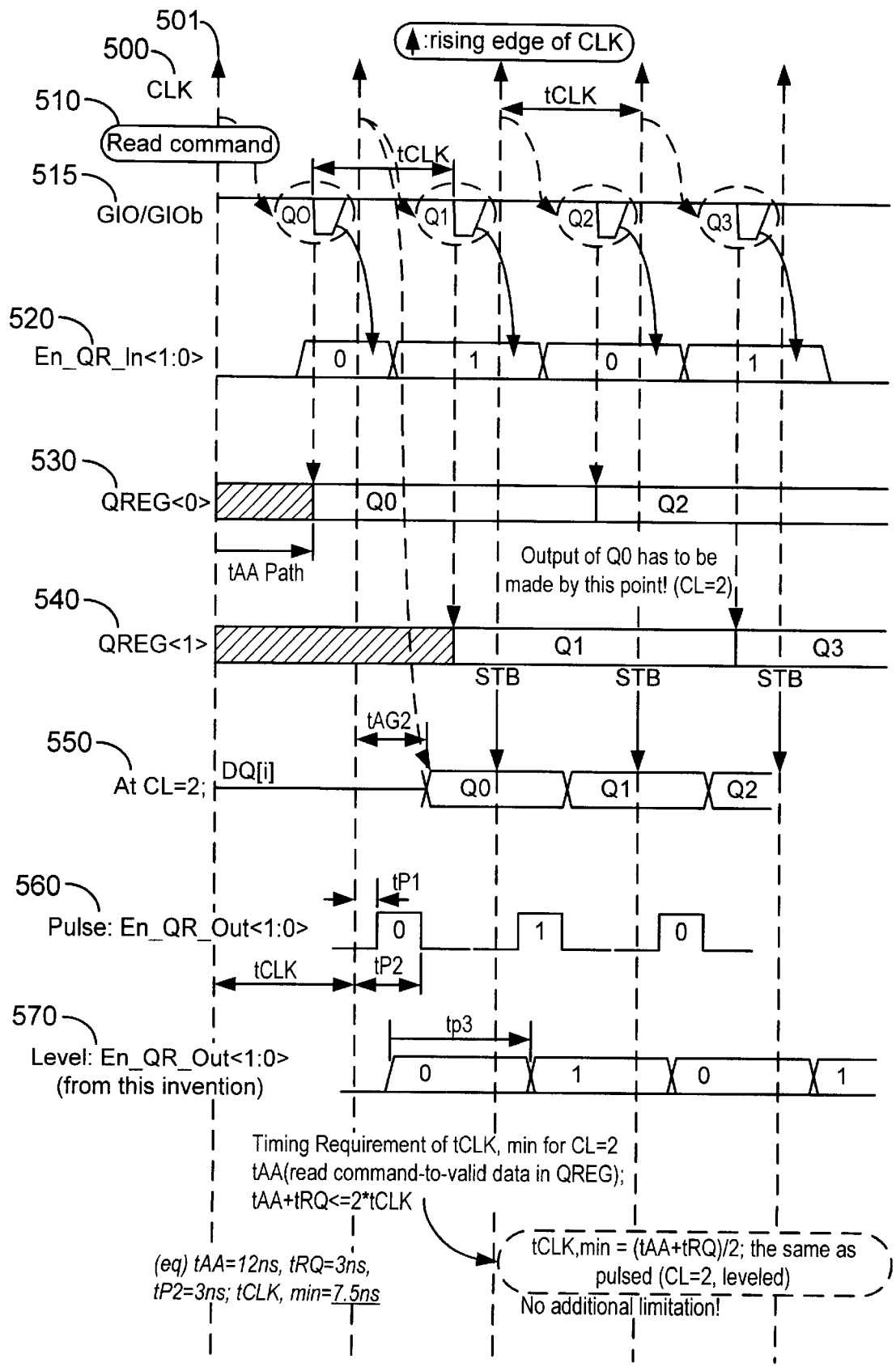
FIG. 5 is a timing diagram illustrating the operational modes of the output enable signals.

FIG. 5 is a timing diagram illustrating the operational modes of the output enable signals as well as the behavior of the output circuit of FIG. 4 for a programmed CAS latency value of L=N−1=2 in a system that supports a maximum latency of L=N=3. System clock CLK is shown at 500 and the period, tCLK (i.e. the system period), is illustrated using arrows 501 to indicate the rising edge of the clock. In response to a read request (i.e. read command) at 510, a first data bit Q0 is retrieved from memory and transmitted to a first output data register QREG<0> over data bus GIO/GIOb at 515. The first data bit is passed into QREG<0> by activating EN_QR_IN<0> as shown at 520. The period between the time of the read request and the time when a data bit is available in an output data register is referred to herein as the address access time ("tAA"). A second data bit Q1 in the data bus serial bit stream is steered into a second output data register QREG<1> by the activation of EN_QR_IN<1> and simultaneous inactivation of EN_QR_IN<0> as shown at 520. Accordingly, successive bits of serial data may be alternately stored in each register. Moreover, if the system supported higher latency values, additional registers may be used for successively storing the serial data. The data in QREG<1:0> is then transmitted to the output terminal under the control of EN_QR_OUT<1:0> in accordance with the latency value L programmed in the system. The technique illustrated by FIGS. 4 and 5 is commonly referred to as pipelining. It should be noted that although the present embodiment illustrates a system supporting a maximum latency value of N=3, other values of N could also be used. For example, for N=4, three output data registers, input enable lines, and output enable lines would be used, and so on.

For a latency value of L=N−1=2, as illustrated in FIG. 5, the techniques of the prior art utilizing pulsed signals for EN_QR_OUT shown at 560 have a severe disadvantage of requiring a unnecessarily large minimum system clock period tCLK. This constraint can be understood by noting that for L=N−1=2, the address access time tAA must not be greater than tCLK+tP2 as shown at 560. As noted above, if this condition occurs then the output of QREG will be inactivated by the falling edge of EN_QR_OUT before the requested data bits are available in QREG. Note, that tP2 corresponds to the width of the pulse when the mode select circuit operates with maximum latency value L=N. The present invention therefore eliminates the constraints of the prior art approach by generating output enable signals which have a first pulse width in a first mode (e.g. L=N) and a second pulse width greater than the first pulse width in a second mode (e.g. L<N). The modes correspond to programmed latency values L such that at a latency of L=N, the maximum latency, a short pulse width is utilized for the output enable signals, and at a latency of less than N, a second longer pulse width is utilized so that the constraints caused by tP2 are eliminated. For example, if a pulse approach as shown at 560 is used for a system having tAA=12 ns, tP2=3 ns, and tRQ=3 ns, then the minimum system clock period (i.e. tCLK,min) for CL=2 is tAA−tP2=9 ns, rather than (tAA+tRQ)/2=7.5 ns. However, according to one embodiment of the present invention, the output circuit operates in a second mode for a latency value less than N. In the second mode, a second pulse width is used that is greater than the first pulse width (i.e. greater than tP2−tP1). According to one embodiment shown at 570, a second pulse width tp3 is substantially equal to tCLK. Accordingly, the tP2 constraint is eliminated. Applying the values from the example above for comparison purposes, the minimum system clock period is now (tAA+tRQ)/2=7.5 ns, rather than tAA−tP2=9 ns.

Figure 6:
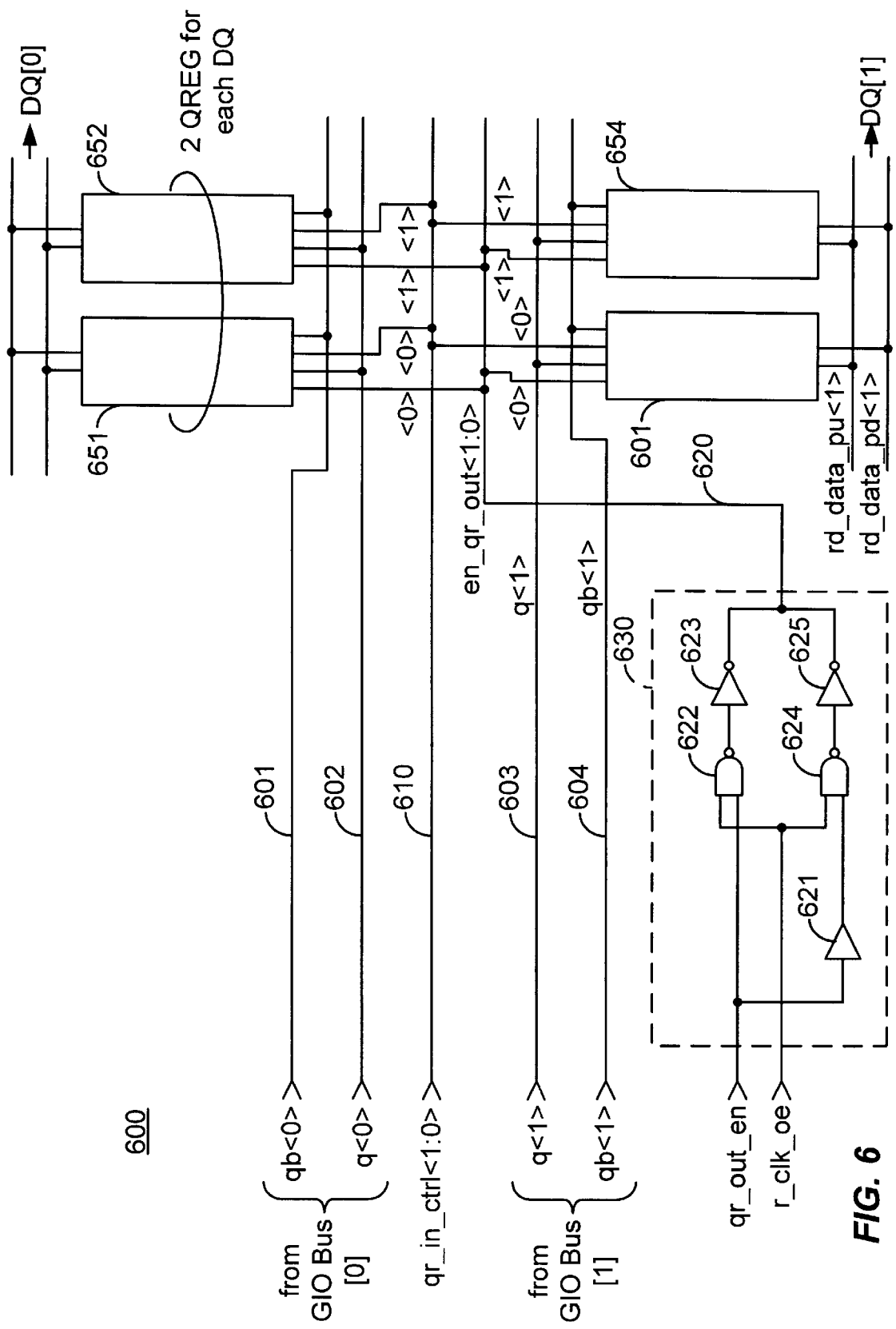
FIG. 6 illustrates an output circuit having two output registers according to one embodiment of the present invention.

FIG. 6 illustrates an output circuit 600 having two output registers for each of two DQ terminals according to another embodiment of the present invention. The output circuit 600 receives data from a data bus (not shown) on lines 601–604. For the present embodiment there are four data output registers that each receive differential values (e.g. q and qb). Output data registers 651 and 652 have outputs coupled to output terminal DQ[0] (not shown) and output data registers 653 and 654 have outputs coupled to DQ[1] (not shown). A first serial data bit is received from the data bus (e.g. GIO bus or global input output bus) and transmitted differentially on lines q<0> 602 and qb<0> 601 to output data register 651. Data on lines q<0> and qb<0> are loaded into the output data register 651 under the control of qr_in_ctrl<0>. Then, a second serial data bit is received from the data bus and transmitted differentially on lines q<0> and qb<0> to output data register 652. Data on lines q<0> and qb<0> are loaded into the output data register 652 under the control of qr_in_ctrl<1>. Likewise, a first serial data bit is received from the data bus and transmitted differentially on lines q<1> 603 and qb<1> 604 to output data register 653. Data on lines q<1> and qb<1> are loaded into the output data register 653 under the control of qr_in_ctrl<0>. Then, a second serial data bit is received from the data bus and transmitted differentially on lines q<1> and qb<1> to output data register 654. Differential data on lines q<1> and qb<1> are loaded into the output data register 654 under the control of qr_in_ctrl<1>.

Data in the four output data registers 651–654 is driven to output terminals DQ[1:0] under the control of EN_QR_OUT<1:0> on line 620. EN_QR_OUT<0> controls output data registers 651 and 653 and EN_QR_OUT<1> controls output data registers 652 and 654. The output enable signals EN_QR_OUT are generated by the mode select circuit. According to the embodiment of FIG. 6, the mode select circuit generates an intermediate enable signal qr_out_en. The intermediate enable signal is processed by a logic circuit 630 comprising inverters 621, 623, and 625, and NAND gates 622 and 624. The logic circuit 630 also receives the signal r_clk_oe. The resulting output enable signal EN_QR_OUT will operate in one of a plurality of modes corresponding to the latency value programmed into the system. In a first mode, the mode select circuit will generate qr_out_en that, when coupled with r_clk_oe in the logic circuit 630, will generate enable signals EN_QR_OUT that have a first pulse width. In a second mode, the mode select circuit will generate qr_out_en that, when coupled with r_clk_oe in the logic circuit 630, will generate enable signals EN_QR_OUT that have a second pulse width greater than the first pulse width.

Figure 7:
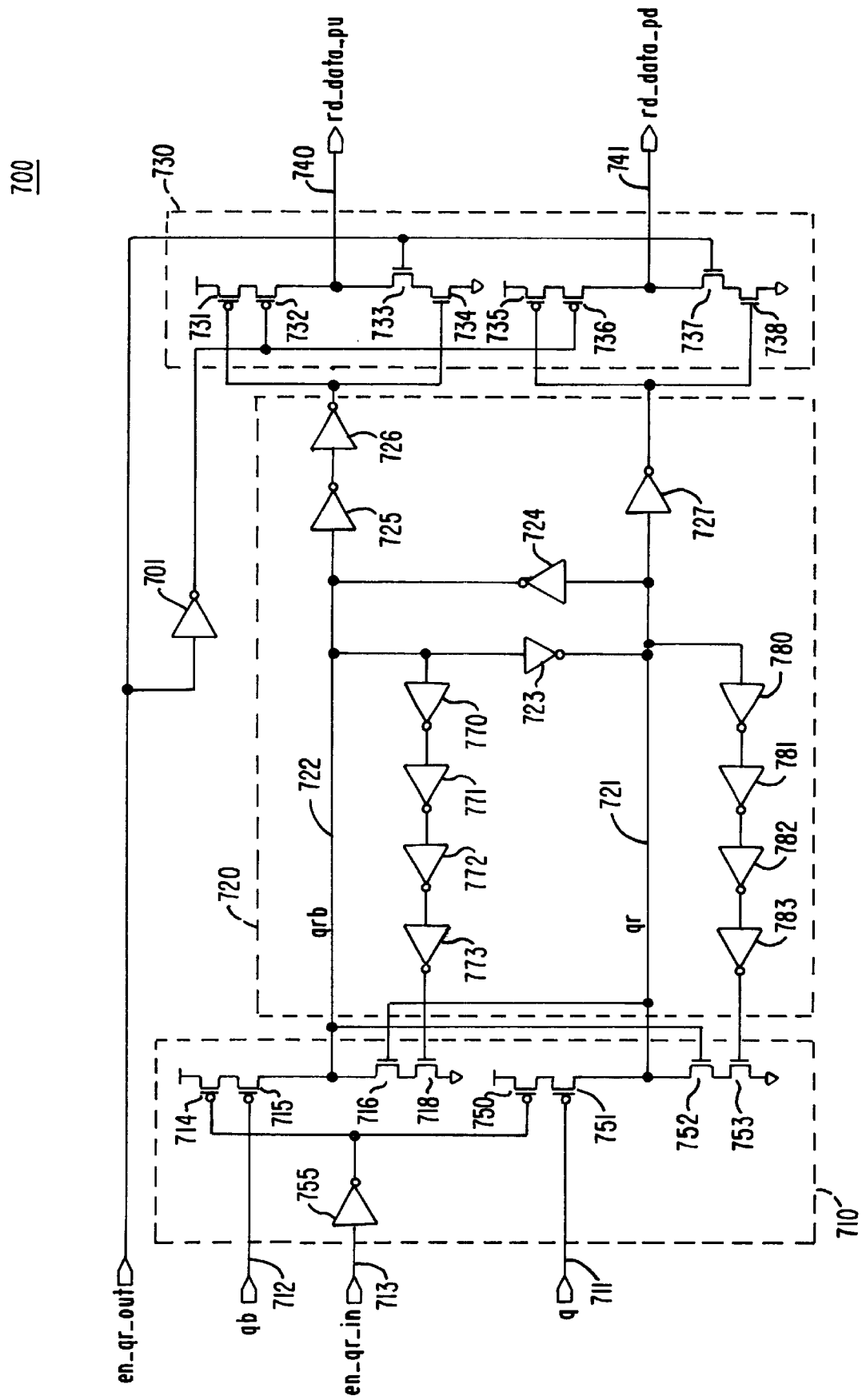
FIG. 7 illustrates an exemplary embodiment of an output register of FIG. 6 according to one embodiment of the present invention.

FIG. 7 illustrates an exemplary embodiment of an output register of FIG. 6 according to one embodiment of the present invention. The output register 700 includes an input stage 710, a latching stage 720, and an output stage 730. The input stage receives differential data bits q and qb at data input terminals 711 and 712. Serial data on the input terminals is latched by the input stage under the control of the input enable signal EN_QR_IN applied to input enable terminal 713. The input stage 710 has a first stage including PMOS transistor 714, PMOS transistor 715, NMOS transistor 716, and NMOS transistor 718 coupled between a voltage supply (e.g. Vcc) and a reference potential (e.g. ground voltage). The input stage 710 also has a second stage including PMOS transistor 750, PMOS transistor 751, NMOS transistor 752, and NMOS transistor 753 coupled between a voltage supply (e.g. Vcc) and a reference potential (e.g. ground voltage). The input enable signal EN_QR_IN is coupled through an inverter 755 to the control terminals of input enable transistors 714 and 750, thereby activating the first and second stages when EN_QR_IN is active (e.g. logic high or 5 volts). The action of EN_QR_IN causes serial data on the data bus to be loaded in parallel into the output data registers. It is to be understood that other methods of serializing the data on lines 711 and 712 could be also used.

The outputs of the first and second stages are coupled to latching stage 720 by signal lines 721 and 722. Latching stage 720 includes cross coupled inverters 723 and 724, a first delay element comprising inverters 770–773, a second delay element comprising inverters 780–783, and output inverters 725, 726, and 727. Data is passed to the output stage 730 by the outputs of inverters 726 and 727. The output stage 730 has a first stage including PMOS transistor 731, PMOS output enable transistor 732, NMOS output enable transistor 733, and NMOS transistor 734 coupled between a voltage supply (e.g. Vcc) and a reference potential (e.g. ground voltage). The output stage 730 also has a second stage including PMOS transistor 735, PMOS output enable transistor 736, NMOS output enable transistor 737, and NMOS transistor 738 coupled between a voltage supply (e.g. Vcc) and a reference potential (e.g. ground voltage). The output enable signal EN_QR_OUT is coupled to the control terminals of output enable transistors 733 and 737. Additionally, EN_QR_OUT is coupled through an inverter 701 to the control terminals of output enable transistors 732 and 736, thereby activating the first and second stages of the output stage when EN_QR_OUT is active (e.g. logic high or 5 volts). Accordingly, in the first mode discussed above, the output stage 730 would be activated by a pulse having a first pulse width, and in the second mode the output stage 730 would be activated by a pulse having a second pulse width greater than the first pulse width. Therefore, it is apparent that data entered into the input stage 710, and subsequently into the latching stage 720, will have a longer period of time to be transmitted to the output terminal by the output stage 730 by following the techniques of the present invention.

FIG. 8A illustrates one example of a mode select circuit 800 for programming the enable signals to operate in one of a plurality of modes that may be used to practice the techniques of the present invention. Mode select circuit 800 may be programmed with a latency value at 850. The present embodiment supports programmed latency values of N=3 and N=2. However, it is to be understood that other mode select circuits according to the present invention may include different architectures and may support other latency values. Accordingly, mode select circuit 800 is merely an example to illustrate how multiple mode output enable signals may be generated. Mode select circuit 800 will operate in two different modes, and generate two corresponding waveforms at the qr_out_en output, depending upon the programmed latency value at 850. Accordingly, the programmed latency value, CL2 at 850, is passed through an inverter 804 and used as a control signal to control transmission gates 805, 806, 807, 808, 809, 810, 811, and 812. The circuit for a transmission gate is illustrated in FIG. 8B and includes two transistors of opposite polarity coupled in parallel. Those skilled in the art will recognize that two transmission gates coupled in parallel with the outputs connected will implement a multiplexing function.

Mode select circuit 800 also receives a pulse clocking signal pu_clk_oe, a reset signal pwr_on_rstb, and data output enables dq_oe_u, dq_oe_l, and dq_oe_top. Mode select circuit 800 generates qr_out_en and r_clk_oe for the input of logic circuit 630 of FIG. 6, which generates EN_QR_OUT. The mode select circuit 800 also supports a data output mask function. Accordingly, the data output enable signal dq_oe includes dq_oe_u for upper byte control, and dq_oe_1 for lower byte control if the masking function is utilized (e.g. for ×16 or wider SDRAM). Therefore, logic circuit 630 input r_clk_oe is coupled to r_clk_oe_u when dq_oe_u is active, and r_clk_oe is coupled to r_clk_oe_1 when dq_oe_1 is active. Furthermore, if the mask function is not utilized, then dq_oe_1, dq_oe_u, and dq_oe_top have the same timing, as illustrated in the simplified schematics below.

Figure 8:
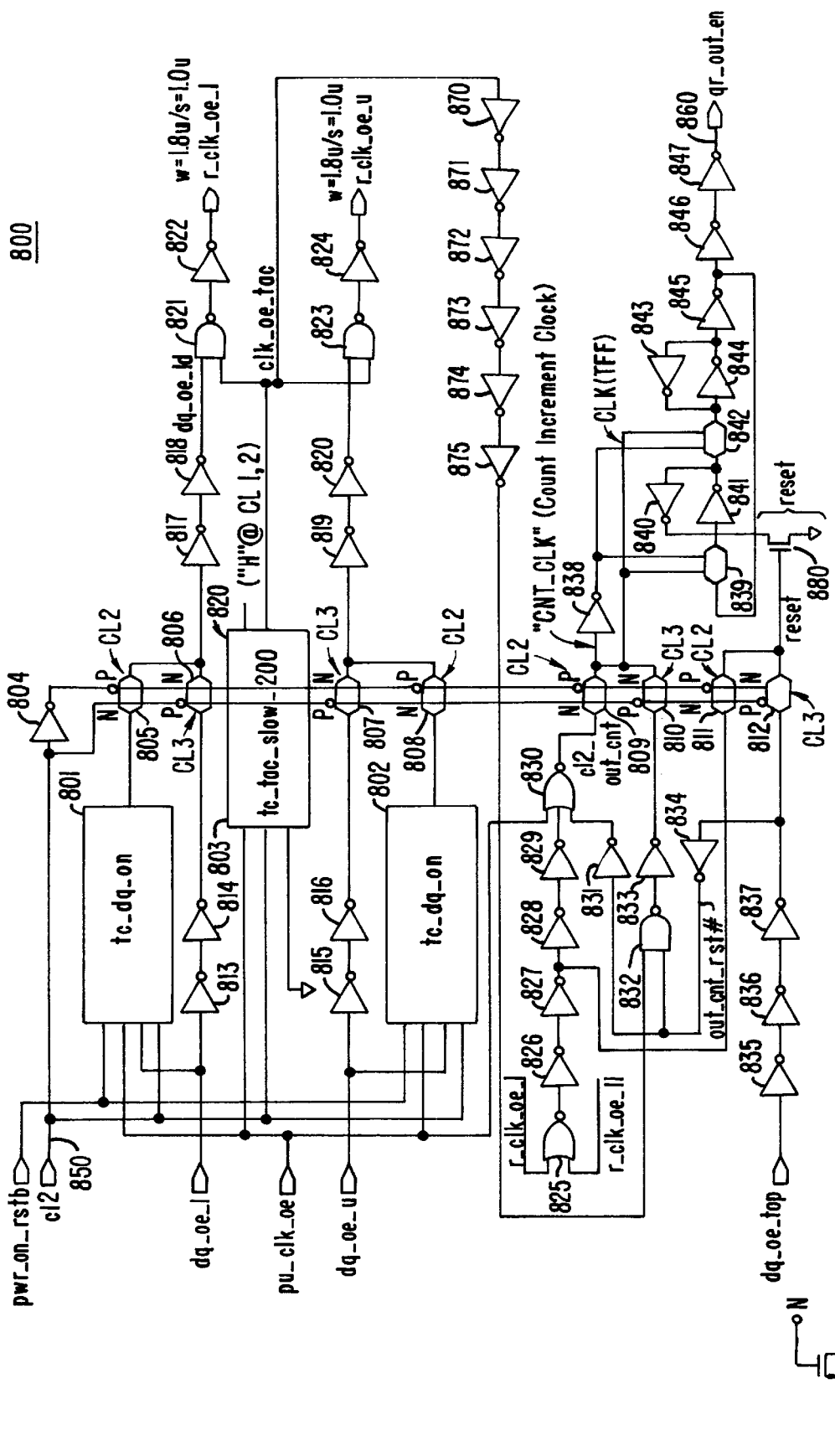
FIG. 8 illustrates a mode select circuit for programming the enable signal to operate in one of a plurality of modes according to one embodiment of the present invention.
Figure 9:
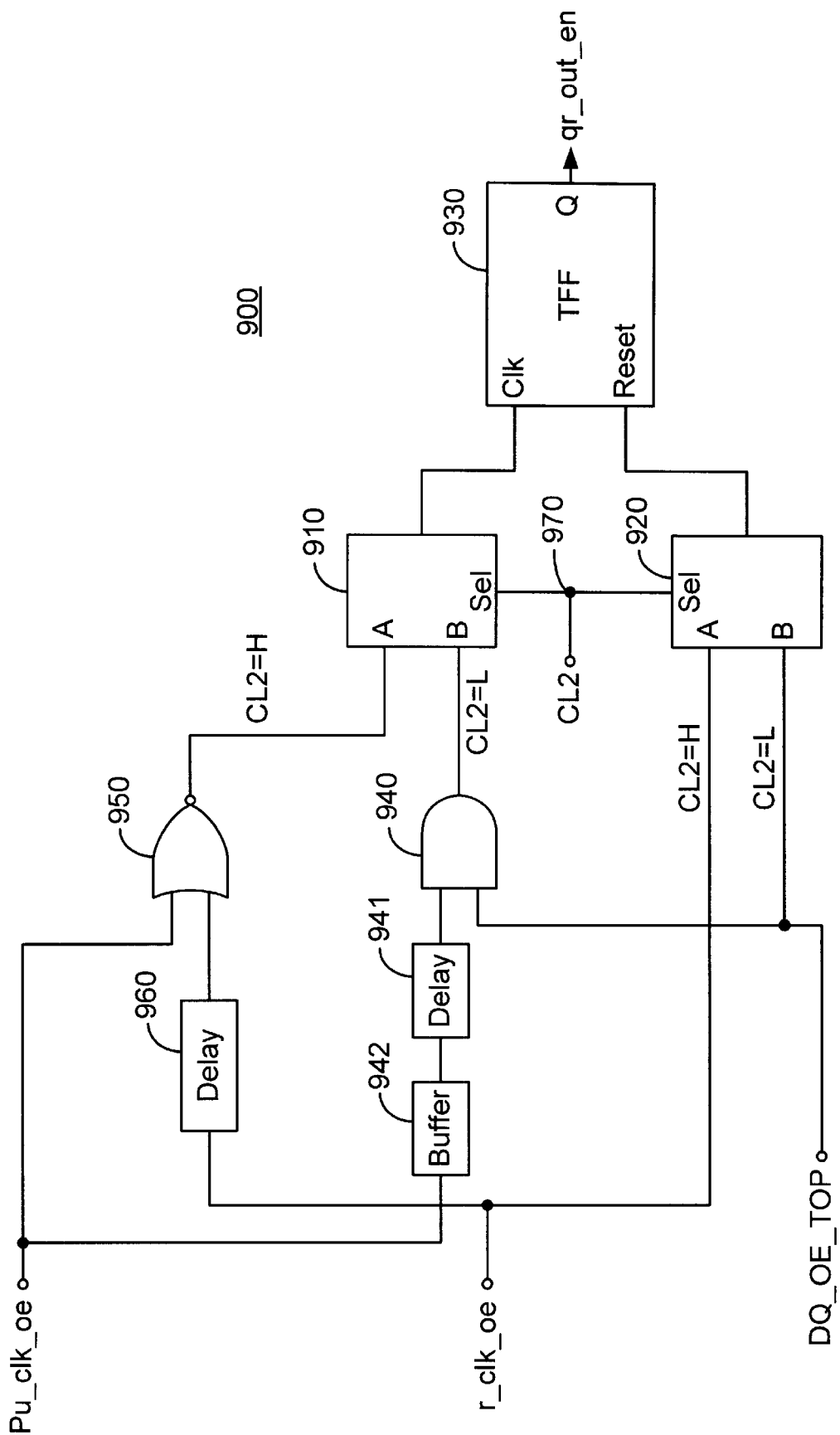
FIG. 9 illustrates a first simplified representation of the mode select circuit of FIG. 8.

FIG. 9 is a first simplified representation of the mode select circuit of FIG. 8 to illustrate how qr_out_en is generated. The mode select circuit 900 includes a toggle flip flop ("TFF") 930. The TFF is a representation of transmission gates 839 and 842, transistor 880, and inverters 837, 838, 840, 841, and 843–847 of FIG. 8. The reset input of the TFF is coupled to a first multiplexor ("MUX") 920. The CLK input (i.e. the toggle input) is coupled to a second multiplexor ("MUX") 910. Both multiplexors 910 and 920 have select inputs SEL coupled to the latency input 970. Accordingly, when a latency of N=2 is programmed into the system, CL will be activated, and each MUX will pass the "A" input to the output. Alternatively, when a latency of N=3 is programmed into the system, CL will be inactive, and each MUX will pass the "B" input to the output. The "A" input of the MUX 910 is coupled to a NOR gate 950 having a first input coupled to receive a clock signal pu_clk_oe, and a second input coupled to the output of a delay element 960. The input of the delay element 960 is coupled to a second clock signal r_clk_oe. The "B" input of the MUX 910 is coupled to an AND gate 940. A first input of the AND gate is coupled to delay element 941 and buffer 942 to receive pu_clk_oe. A second input of the AND gate is coupled to DQ_OE_TOP. The "A" input of MUX 920 is coupled to r_clk_oe. The "B" input of MUX 920 is coupled to DQ_OE_TOP. The output of the circuit is qr_out_en.

Figure 10:
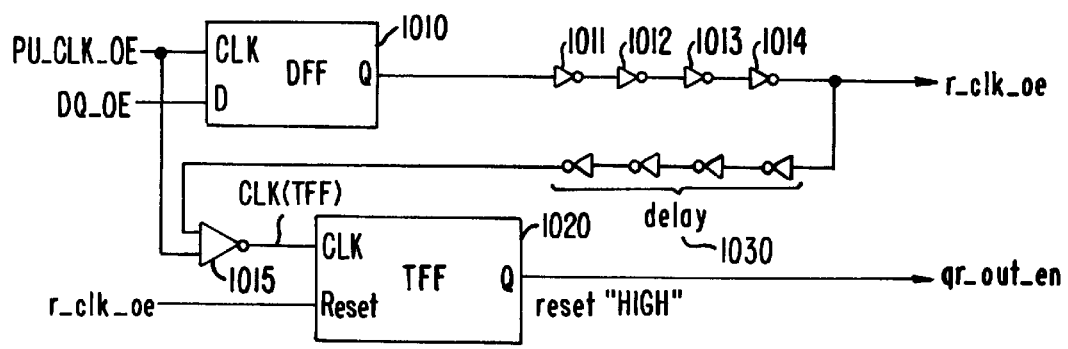
FIG. 10 illustrates a simplified representation of the mode select circuit of FIG. 8 for a CAS latency of two.

To further illustrate the operation of FIG. 8, FIG. 10 illustrates a simplified representation of the mode select circuit of FIG. 8 for a CAS latency of two. When a CAS latency value of two is programmed into the mode select circuit of FIG. 8 (e.g. CL2=logic high), the transmission gates will configure the circuit into a state that can be represented by FIG. 10. In this state, the mode select circuit includes a D-flip flop ("DFF") 1010 having a clock input CLK for receiving pulse signal pu_clk_oe, a data input D for receiving data output enable signal dq_oe, and an output Q for providing the output of the DFF. The output Q of the DFF is coupled through inverters 1011, 1012, 1013, and 1014 to generate the signal r_clk_oe, which is coupled with qr_out_en to generate EN_QR_OUT. The mode select circuit also includes a toggle flip flop ("TFF") 1020. The TFF has a reset input coupled to r_clk_oe. A NOR gate 1015 has a first input coupled to pu_clk_oe, a second input coupled to r_clk_oe through delay element 1030, and an output coupled to a clock input of the TFF. The delay element 1030 may comprise a plurality of series coupled inverters, for example. Intermediate enable signal qr_out_en is generated at the output of TFF 1020.

Figure 11:
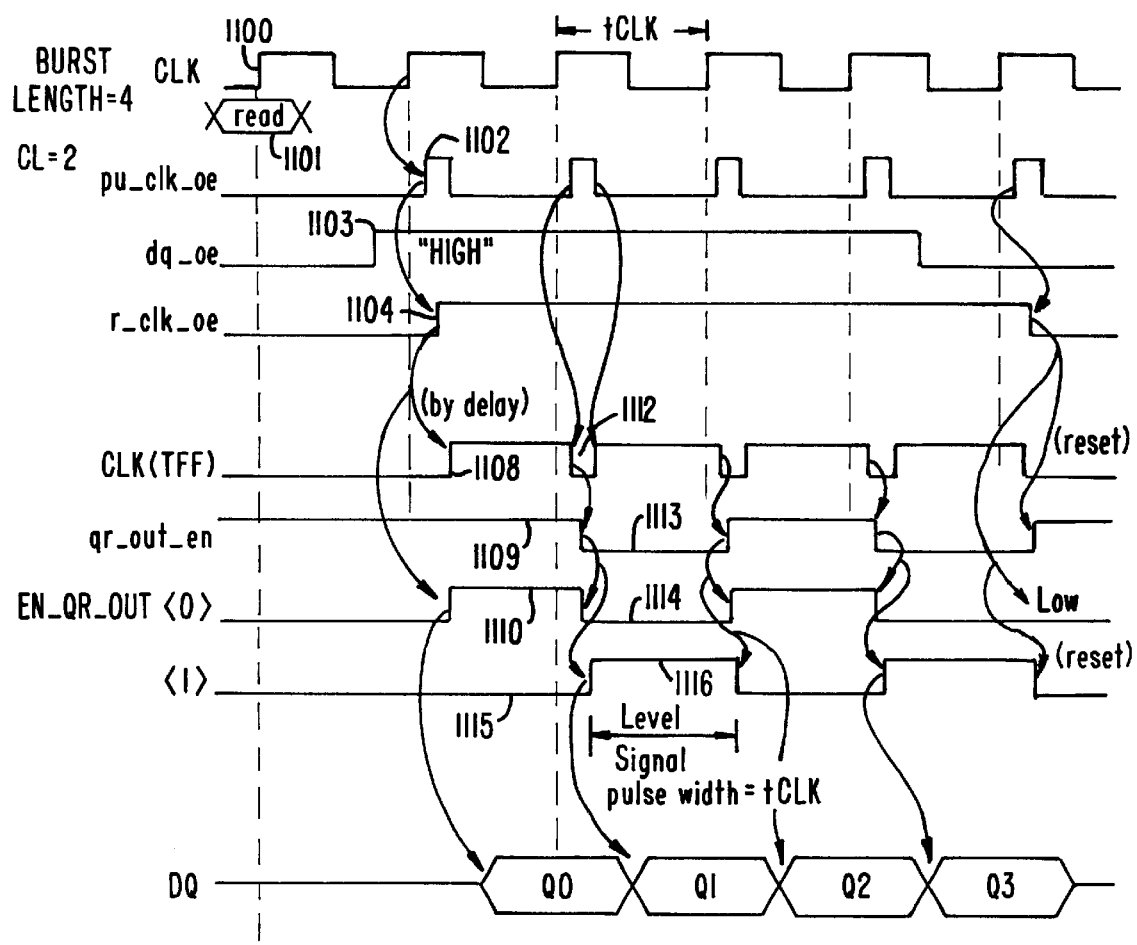
FIG. 11 is a timing diagram illustrating the operation of the mode select circuit of FIG. 10 for a CAS latency of two.

The operation of the mode select circuit when programmed with a CAS latency of two can be further understood by referring to FIG. 11. FIG. 11 is a timing diagram illustrating the operation of the mode select circuit of FIG. 10 for a CAS latency of two. FIG. 11 also illustrates how the present invention may be employed to output data in a burst mode (e.g. a burst length of 4). A read signal is received at 1101 indicating that data is to be transmitted to the output terminals DQ. The read signal is read into the system on the rising edge of system clock 1100. For a CAS latency value of 2, the first bit of data must be received at the output terminal DQ[0] within two clock cycles. Data output enable signal dq_oe is activated at 1103 and is used to enable data to flow to the output terminals. At 1102, the first pulse in the pu_clk_oe pulse signal train is activated. At 1104, r_clk_oe is activated by the action of the output of DFF 1010 and the series coupled inverters 1011–1014. The clock input to TFF 1020, designated CLK(TFF), is activated at 1108 by the output of NOR gate 1015 after r_clk_oe has propagated through the delay element 1030. Accordingly, qr_out_en is active at 1109. With r_clk_oe active at 1104 and qr_out_en active, EN_QR_OUT<0> is activated at 1110 by the logic circuit 630 of FIG. 6. Accordingly, the first bit of retrieved data Q0 in the first output register is passed to the output terminal by the activation of EN_QR_OUT and may be read at the output terminal two clock cycles after the read request.

The next pulse in pu_clk_oe clocks the input of the TFF at 1112 and results in a change in the state of qr_out_en for the time interval 1113. Accordingly, EN_QR_OUT<0> is inactivated and EN_QR_OUT<1> is activated by logic circuit 630 for the time intervals 1114 and 1116, respectively. Accordingly, the second bit of retrieved data Q1 in the second output register is passed to the output terminal by the activation of EN_QR_OUT<1> and may be read at the output terminal immediately after the transmission of Q0. In a similar manner, the successive pulses in the pu_clk_oe pulse train control qr_out_en, r_clk_oe, and EN_QR_OUT to successively transmit data bits Q2 and Q3 to the output terminal and thereby complete the burst mode transaction. For the embodiment illustrated in FIG. 10 and FIG. 11, the pulse width of EN_QR_OUT is substantially equal to the system clock period TCLK and may be referred to as a "logic level" signal or alternatively as "level logic." It is to be understood, however, that in other implementations of the mode select circuit other pulse widths could be used when the programmed latency value L is less than N, so long as the equation $((L-1)*tCLK)+tP2>tAA$ is satisfied. Accordingly, the mode select circuit will operate in the first mode and have a first pulse width when the equation $tAA \leq ((L-1)*tCLK)+tP2$ is satisfied, and the mode select circuit will operate in a second mode and have a second pulse width greater than the first pulse width when the equation $tAA \geq ((L-1)*tCLK)+tP2$ is satisfied.

Figure 12:
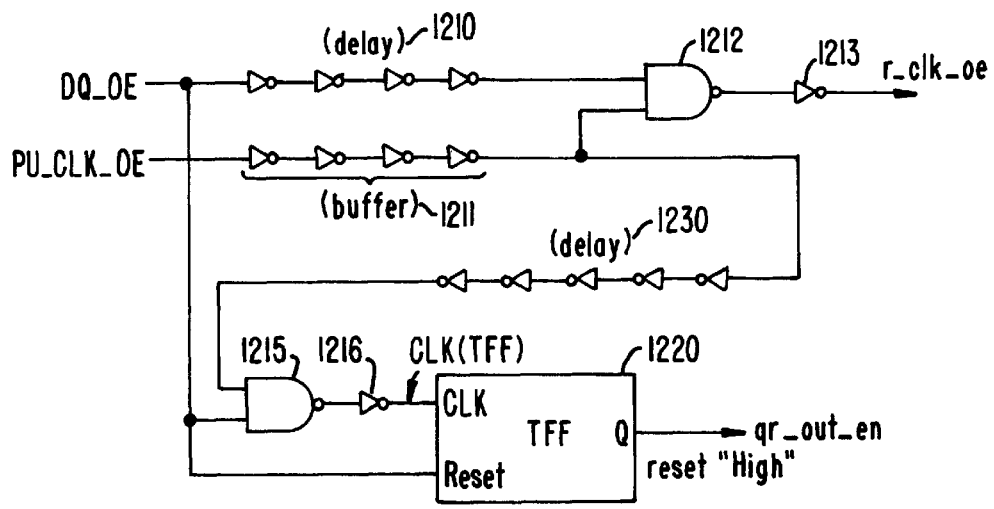
FIG. 12 illustrates a simplified representation of the mode select circuit of FIG. 8 for a CAS latency of three.

FIG. 12 illustrates a simplified representation of the mode select circuit of FIG. 8 for a CAS latency of three. When a CAS latency value of three is programmed into the mode select circuit of FIG. 8 (e.g. CL2=logic low), the transmission gates will configure the circuit into a state that can be represented FIG. 12. In this state, the mode select circuit includes a buffer element 1211 having a first input coupled to receive pulse signal pu_clk_oe and an output for providing a buffered signal to a first input of NAND gate 1212. The second input of NAND gate 1212 is coupled to the output of a delay element 1210. The input of the delay element 1210 is coupled to receive data output enable signal dq_oe. The output of NAND gate 1212 is coupled to inverter 1213. The output of inverter 1213 is r_clk_oe. The mode select circuit also includes a toggle flip flop ("TFF") 1220. The TFF has a reset input coupled to dq_oe. A NAND gate 1215 has a first input coupled to dq_oe, a second input coupled to r_clk_oe through delay element 1230, and an output coupled to a clock input of the TFF through an inverter 1216. The delay element 1230 may comprise a plurality of series coupled inverters, for example. Intermediate enable signal qr_out_en is generated at the output of TFF 1220.

Figure 13:
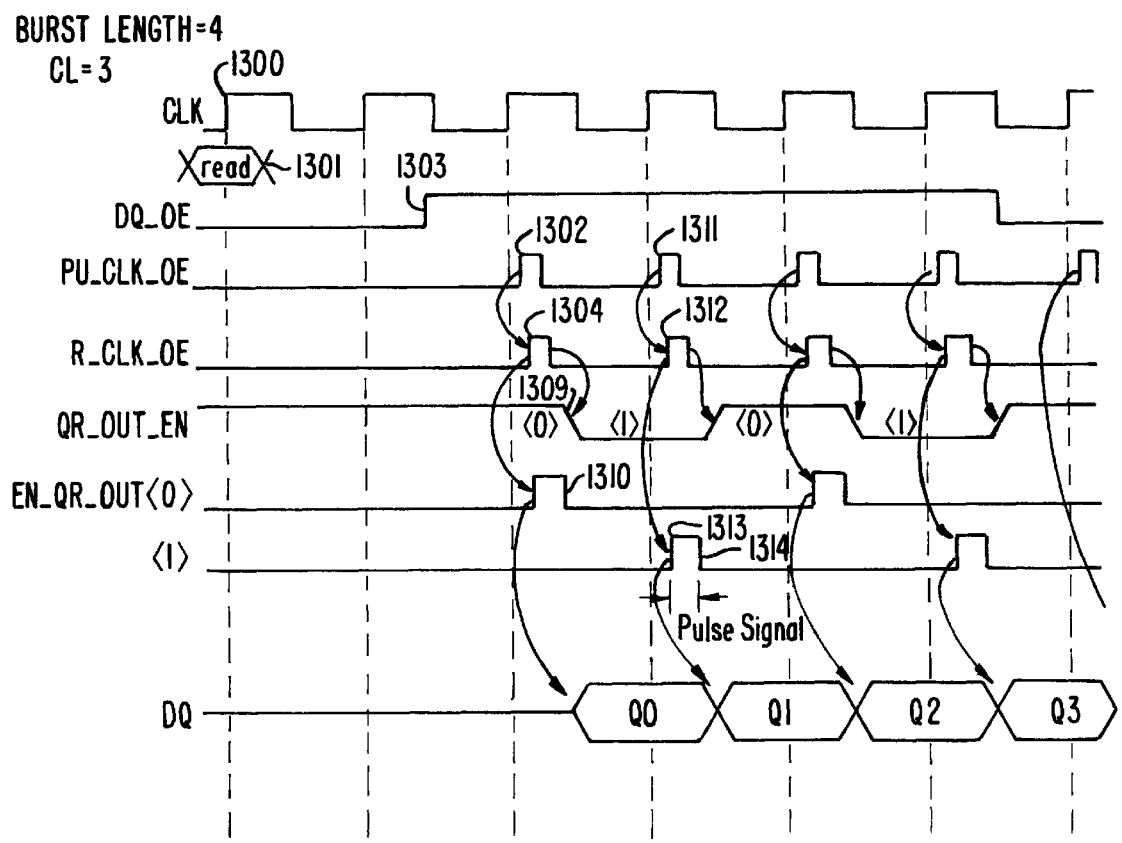
FIG. 13 is a timing diagram illustrating the operation of the mode select circuit of FIG. 12 for a CAS latency of three.

The operation of the mode select circuit when programmed with a CAS latency of three can be further understood by referring to FIG. 13. FIG. 13 is a timing diagram illustrating the operation of the mode select circuit of FIG. 12 for a CAS latency of three. FIG. 13 also illustrates how the present invention may be employed to output data in a burst mode (e.g. a burst length of 4). A read signal is received at 1301 indicating that data is to be transmitted to the output terminals DQ. The read signal is read into the system on the rising edge of system clock 1300. For a CAS latency value of 3, the first bit of data must be received at the output terminal DQ[0] within three clock cycles. Data output enable signal dq_oe is activated at 1303 and is used to enable data to flow to the output terminals. At 1302, the first pulse in the pu_clk_oe pulse signal train is activated. At 1304, r_clk_oe is activated by the action of delay element 1210, buffer element 1211, NAND gate 1212, and inverter 1213. R_clk_oe and qr_en_out are combined in logic circuit 630 to activate EN_QR_OUT<0>. However, contrary to the case were the CAS latency value is two, when the first pu_clk_oe pulse is deactivated (i.e. on the falling edge of the first pu_clk_oe pulse), r_clk_oe is deactivated, and qr out_en is deactivated (i.e. logic low). Accordingly, qr_out_en is inactive at 1309 and EN_QR_OUT<0> is inactivated at 1310. Therefore, the first bit of retrieved data Q0 in the first output register is passed to the output terminal by the activation of EN_QR_OUT<0> and may be read at the output terminal three clock cycles after the read request.

The next pulse in pu_clk_oe at 1311 generates a second pulse in r_clk_oe at 1312. The second r_clk_oe pulse is combined with en_qr_out, which is in a logic low state, in logic circuit 630. Accordingly, EN_QR_OUT<1> is activated at 1313. Accordingly, the second bit of retrieved data Q1 in the second output register is passed to the output terminal by the activation of EN_QR_OUT<1> and may be read at the output terminal immediately after the transmission of Q0. When pu_clk_oe is inactivated, r_clk_oe is inactivated, and EN_QR_OUT<1> is inactivated by logic circuit 630 at 1314. In a similar manner, the successive pulses in the pu_clk_oe pulse train control qr_out en, r_clk_oe, and EN_QR_OUT to successively transmit data bits Q2 and Q3 to the output terminal and thereby complete the burst mode transaction. For the embodiment illustrated in FIG. 12 and FIG. 13, the pulse width of EN_QR_OUT is equal to the pulse width of pu_clk_oe and may be referred to as a "pulsed" signal.

Figure 14:
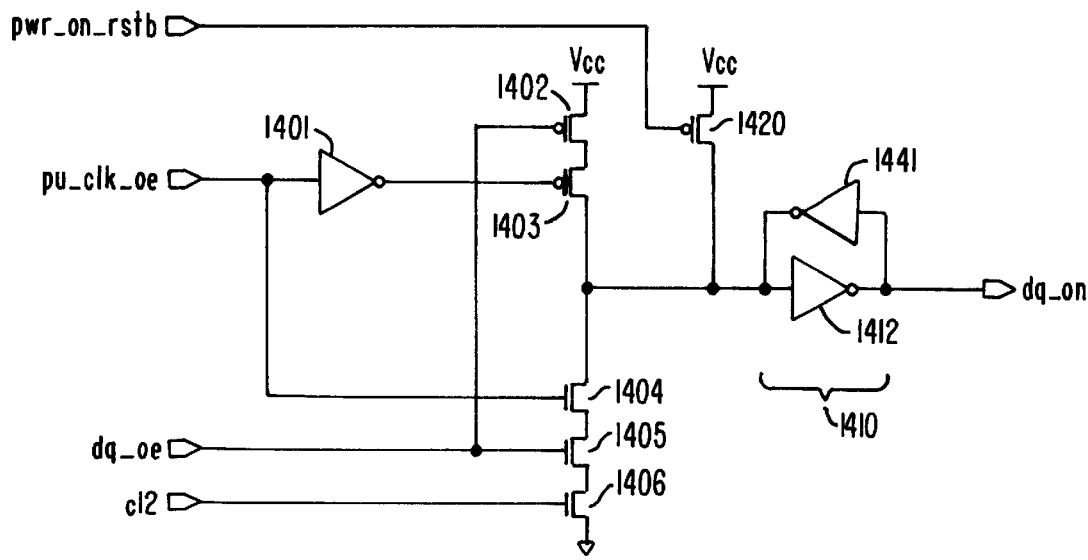
FIG. 14 illustrates an exemplary circuit for implementing the tc_dq_on of FIG. 8.

FIG. 14 illustrates an exemplary circuit 400 for implementing the tc_dq_on of FIG. 8. As seen from the schematic in FIG. 14, tc_dq_on implements the operation of a DFF. Tc_dq_on DFF circuit 400 receives signals pu_clk_on, dq_oe, CL2, and a power on reset signal pwr_on_rstb which is active low. DFF circuit 400 includes an inverter 1401 having an input coupled to pu_clk_oe, and a string of transistors 1402–1406 coupled in series between a first reference voltage (e.g. Vcc) and a second reference voltage (e.g. ground). Transistors 1402 and 1403 are PMOS transistors and transistors 1404–1406 are NMOS transistors. The control terminals of transistors 1402 and 1405 are coupled to receive dq_oe. The control terminal of transistor 1406 is coupled to receive CL2. The control terminal of transistor 1403 is coupled to receive the inverted pu_clk_oe and the control terminal of 1404 is coupled to receive pu_clk_oe. Accordingly, pu_clk_oe acts to clock the value of dq_oe into the DFF, and CL2 enables or disables the input. DFF circuit 400 also includes a cross coupled inverter latch 1410 comprised of cross coupled inverters 1411 and 1412 for storing a data bit and providing an output at dq_on. The latch 1410 may be reset by pwr_on_rstb going low and turning on PMOS reset transistor 1420.

Figure 15:
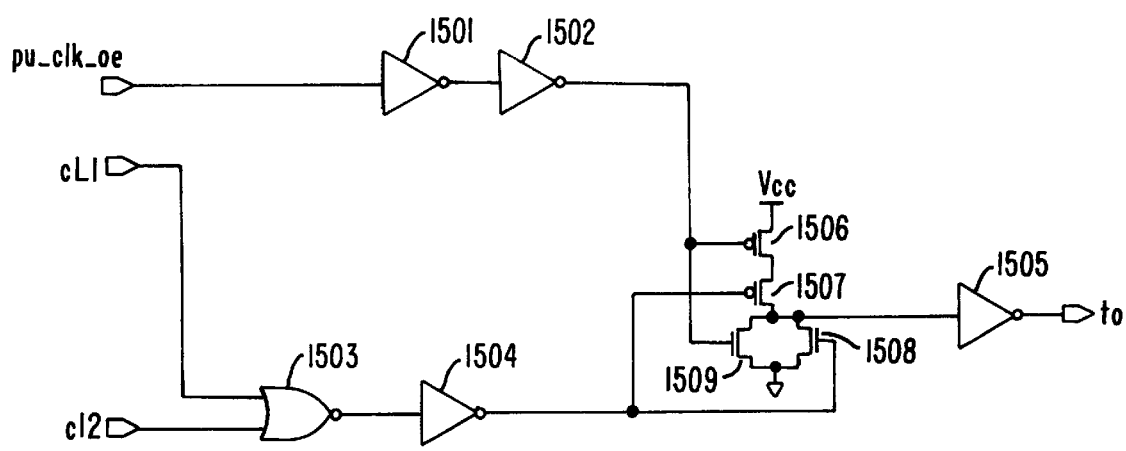
FIG. 15 illustrates an exemplary circuit for implementing the tc_tac_slow_200 of FIG. 8.

FIG. 15 illustrates an exemplary circuit for implementing tc_tac_slow_200 of FIG. 8. The circuit of FIG. 15 implements a buffer element when CL2 is active (e.g. logic high), and has an output of Vcc when CL2 is inactive. Tc_tac_slow_200 includes a pair of inverters 1501 and 1502 coupled in series to receive pu_clk_oe. Inputs CL1 and CL2 are received by NAND gate 1503. The output of NAND gate 1503 is received by inverter 1504. Referring to FIG. 8, CL1 is grounded (i.e. logic low). The output of inverter 1502 is applied to the inputs of transistors 1506 and 1509, and the output of inverter 1504 is applied to the inputs of transistors 1507 and 1508. Transistors 1506–1509 form a NOR function. The output of transistors 1506–1509 is received by inverter 1505.

Having fully described alternative embodiments of the present invention, other equivalent or alternative techniques for providing an output circuit that is operable in multiple modes in accordance with a programmable latency according to the present invention will be apparent to those skilled in the art. For example, other embodiments may include a mode select circuit that supports other maximum latencies N. Additionally, other embodiments of the mode select circuit may employ modifications of the logic circuits or signals to implement output enable signals that operate in multiple modes according to the programmed latency value. Accordingly, the embodiments disclosed above should be considered illustrative and not limiting when considered in light of the attached claims.

What is claimed is:

1. A data transmission circuit having a maximum programmable latency of N, the circuit comprising:
    an output terminal;
    N−1 output registers configured to store N−1 bits of data, each output register having an output coupled to the output terminal; and
    a parallel-to-serial converter coupled to the N−1 output registers and configured to serialize the N−1 bits of data in response to an output enable signal,
    wherein, when the circuit operates with a latency of N, the output enable signal has a first pulsed width, and when the circuit operates with a latency less than N, the output enable signal has a second pulse width.

2. The circuit of claim 1 wherein N is an integer.

3. The circuit of claim 1 further comprising a serial-to-parallel converter coupled to receive a serial stream of data and to convert the serial data into the N−1 bits of data in the N−1 output registers.

4. The circuit of claim 1 wherein each output register includes an input stage, and wherein the serial-to-parallel converter comprises a input enable transistor coupled in series with the input stage.

5. The circuit of claim 4 wherein input enable transistor is a PMOS transistor.

6. The circuit of claim 1 wherein each output register includes an output stage, and wherein the parallel-to-serial converter comprises a output enable circuit coupled in series with the output stage, the output enable circuit having control terminals coupled to the output enable signal.

7. The circuit of claim 6 wherein the output enable circuit comprises an NMOS transistor.

8. The circuit of claim 7 wherein the output enable circuit further comprises a PMOS transistor.

9. The circuit of claim 1 wherein the first pulse width is less than a system clock period and the second pulse width is substantially equal to the system clock period.

10. The circuit of claim 1 wherein the programmable latency period is 3 and the plurality of data registers and corresponding enable signals is 2.

11. The circuit of claim 1 wherein the parallel-to-serial converter comprises a multiplexor.

12. A method of operating a pipelined circuit having a maximum latency of N, the method comprising:
converting data from a serial bit stream to N−1 parallel bits of data;
steering the N−1 parallel bits of data into N−1 output registers;
converting the N−1 parallel bits of data into serial data, wherein when the circuit operates with a latency of N, the conversion utilizes output enable signals having a first pulse width, and when the circuit operates with a latency of less than N, the conversion utilizes output enable signals having a second pulse width.

13. The method of claim 12 further comprising successively transmitting the data in the output registers to an output terminal.

14. The method of claim 12 further comprising successively coupling output stages of the output registers to the output terminal.

15. The method of claim 12 wherein the first pulse width is less than a system clock period and the second pulse width is substantially equal to the system clock period.

16. A data transmission circuit comprising:
an output terminal;
a plurality of data registers each coupled between the output terminal and a data bus, each storing successive data bits received serially from the data bus;
a plurality of enable signals each coupled to a corresponding data register, wherein when one of the plurality of enable signals is active a data bit in the corresponding data register is coupled to the output terminal and when one of the plurality of enable signals is inactive a data bit in the corresponding data register is not coupled to the output terminal; and
a mode select circuit to program the plurality of enable signals to operate in one of a plurality of modes corresponding to a programmable latency period, wherein in a first mode the enable signals have a first pulse width and in a second mode the enable signals have a second pulse width greater than the first pulse width.

17. The data transmission circuit of claim 16 wherein the maximum programmable latency period is N and the plurality of data registers and corresponding enable signals is N−1.

18. The data transmission circuit of claim 17 wherein when the latency period is programmed for N the enable signals operate in the first mode, and when the latency period is programmed for less than N the enable signals operate in the second mode.

19. The data transmission circuit of claim 17 wherein the programmable latency period is 3 and the plurality of data registers and corresponding enable signals is 2.

20. The data transmission circuit of claim 16 wherein the second mode corresponds to a condition when the following equation is satisfied:

$$tAA \geq ((L-1)*tCLK)+tP2.$$

21. The data transmission circuit of claim 16 wherein the first mode corresponds to a condition when the following equation is satisfied:

$$tAA \geq ((L-1)*tCLK)+tP2.$$

22. The data transmission circuit of claim 16 further comprising a memory array coupled to the data bus.

23. The data transmission circuit of claim 16 wherein the first pulse width is less than a system clock period and the second pulse width is substantially equal to the system clock period.

24. The data transmission circuit of claim 16 wherein the mode select circuit receives a latency signal corresponding to a latency period for programming the plurality of enable signals.

25. The data transmission circuit of claim 16 wherein the data transmission circuit is a pipeline output circuit.

26. The data transmission circuit of claim 16 wherein the data transmission circuit is coupled to a synchronous DRAM.

27. The data transmission circuit of claim 16 wherein the data transmission circuit is coupled to an asynchronous DRAM.

28. A method of transmitting data to an output terminal of a data transmission circuit comprising:
programming a latency period;
programming a plurality output enable signals to operate in one of a plurality of modes corresponding to the latency period, wherein in a first mode the output enable signals have a first pulse width and in a second mode the output enable signals have a second pulse width;
sequentially storing output data in a plurality of output registers, wherein each output register is coupled to the output terminal;
generating the plurality of output enable signals; and
coupling each of the plurality of output enable signals to a corresponding one of the plurality of output registers, wherein each output enable signal selectively couples a data bit in a corresponding output register to the output terminal.

29. The method of claim 28 wherein the output enable signals operate in the first mode when the latency period is programmed with a maximum latency period of N, and the output enable signals operate in the second mode when the latency period is programmed with a value less than N.

30. The method of claim 28 further comprising receiving serial data in the output registers in response to a read request.

31. The method of claim 28 wherein the first pulse width is less than a system clock period and the second pulse width is substantially equal to the system clock period.

32. A data transmission circuit for use in a semiconductor memory comprising:
a plurality of output registers coupled in parallel between a memory block of said semiconductor memory and an output terminal, each register receiving an enable pulse signal such that for the duration of the pulse the corresponding output register is enabled to transfer data received from the memory block to the output terminal,
wherein in response to a read request the semiconductor memory outputs data on the output terminal upon the occurrence of a predesignated number L of clock cycles relative to the read request, the memory block having an access time tAA substantially equal to a time delay from the read request to when the corresponding data is valid in an output register, each output register having a data transfer time tRQ substantially equal to a time delay from when the output register is enabled by the enable pulse signal to when data is valid at the output terminal,
wherein for different values of L the duration of the enable pulse signals are varied so that the semiconductor memory is capable of operating at a minimum clock cycle defined by (tAA+tRQ)/L.

33. The data transmission circuit of claim 32 wherein the enable pulse signal has a first pulse width for a maximum value selected for L, and a larger pulse width for values less than the maximum value.

* * * * *